(12) United States Patent
Deppe

(10) Patent No.: US 9,442,247 B2
(45) Date of Patent: Sep. 13, 2016

(54) BRANCHED SHAPE OPTICAL ISOLATOR AND OPTICAL APPARATUS, METHOD AND APPLICATIONS

(71) Applicant: University of Central Florida Research Foundation Inc., Orlando, FL (US)

(72) Inventor: Dennis Deppe, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 157 days.

(21) Appl. No.: 13/663,675

(22) Filed: Oct. 30, 2012

(65) Prior Publication Data

US 2013/0107901 A1    May 2, 2013

Related U.S. Application Data

(60) Provisional application No. 61/554,678, filed on Nov. 2, 2011.

(51) Int. Cl.

| | |
|---|---|
| *G02B 6/12* | (2006.01) |
| *B82Y 20/00* | (2011.01) |
| *H01S 5/00* | (2006.01) |
| *H01S 5/022* | (2006.01) |
| *H01S 5/14* | (2006.01) |
| *H01S 5/34* | (2006.01) |

(52) U.S. Cl.
CPC ........... *G02B 6/12004* (2013.01); *B82Y 20/00* (2013.01); *G02B 2006/12061* (2013.01); *G02B 2006/12121* (2013.01); *G02B 2006/12126* (2013.01); *G02B 2006/12157* (2013.01); *H01S 5/0064* (2013.01); *H01S 5/0224* (2013.01); *H01S 5/141* (2013.01); *H01S 5/3412* (2013.01)

(58) Field of Classification Search
CPC .............. G02B 6/2746; G02B 6/4208; G02B 2006/12157
USPC ........................................................ 385/44, 45
See application file for complete search history.

(56) References Cited

U.S. PATENT DOCUMENTS

| | | | | |
|---|---|---|---|---|
| 4,756,587 A * | 7/1988 | Sano | ................... | G02B 6/12002 385/27 |
| 5,463,705 A * | 10/1995 | Clauberg | ............... | G02B 6/125 385/14 |
| 5,764,825 A * | 6/1998 | Mugino | ............. | G02B 6/12007 385/14 |
| 5,818,989 A * | 10/1998 | Nakamura | ............. | G02B 6/125 385/39 |
| 6,157,760 A * | 12/2000 | Fujita | ....................... | G02B 6/42 359/333 |
| 6,885,795 B1 * | 4/2005 | Hsu | ..................... | G02B 6/12004 385/48 |
| 7,099,539 B1 * | 8/2006 | Au et al. | .......................... | 385/45 |
| 7,499,613 B2 * | 3/2009 | Hida | ...................... | G02B 6/125 385/15 |
| 8,660,391 B1 * | 2/2014 | Fish | ....................... | B82Y 20/00 359/484.03 |
| 2004/0071388 A1 * | 4/2004 | Benzoni et al. | ................ | 385/14 |

(Continued)

*Primary Examiner* — Charlie Y Peng
(74) *Attorney, Agent, or Firm* — William Greener; Alek P. Szecsy; Bond, Schoeneck & King, PLLC

(57) ABSTRACT

A branched optical isolator includes, located over a substrate, at least two branches connected to a trunk at a junction location. At least one branch comprises an optical absorber material and at least one branch comprises an optical transmitter material. The optical isolator may be incorporated into an optical chip carrier such that: (1) an optical emitting portion of an optical chip integral to or attached to the optical chip carrier; and (2) a connection to the optical isolator, are butt connected with a gap less than 10 nanometers, and otherwise materials matched. The optical isolator provides for attenuated backscattered optical radiation into the optical chip.

16 Claims, 12 Drawing Sheets

(56) References Cited

U.S. PATENT DOCUMENTS

| | | | |
|---|---|---|---|
| 2005/0123232 A1* | 6/2005 | Piede | G02B 6/1228 385/14 |
| 2009/0087155 A1* | 4/2009 | Watanabe | 385/131 |
| 2010/0008622 A1* | 1/2010 | Watanabe | G02B 6/423 385/14 |
| 2013/0014813 A1* | 1/2013 | Wang | H01L 31/06875 136/255 |

* cited by examiner (c) Pattern and etch trench for oxidation (d) Selectively oxidize

BRANCHED SHAPE OPTICAL ISOLATOR AND OPTICAL APPARATUS, METHOD AND APPLICATIONS

CROSS-REFERENCE TO RELATED APPLICATION

This application is related to, and derives priority from, U.S. Provisional Patent Application Ser. No. 61/554,678, filed 2 Nov. 2011 and titled "Optical Isolator and Laser Apparatus, Method and Applications," the content of which is incorporated herein fully by reference.

BACKGROUND

1. Field of the Invention

The invention relates generally to optical apparatus (i.e., laser apparatus). More particularly the invention relates to integrated and optically isolated optical apparatus and semiconductor lasers.

2. Description of the Related Art

Laser apparatus are common apparatus with various applications in the optical data processing, storage and communication fields. While such laser apparatus and optical data communication systems are desirable within the optical communications fields, such laser apparatus are nonetheless not entirely without problems. Thus desirable within the optical data processing, storage and communication fields are laser apparatus and related components with enhanced optical performance capabilities.

SUMMARY

An optical isolator is a component that prevents unwanted optical signals or optical noise from entering additional optical components. The additional optical components may be lasers, optical fibers, detectors, or other components. Lasers are particularly sensitive to unwanted optical signals or optical noise that enter their laser cavity and cause noise problems. Optical isolators have become heavily used in combination with optical fibers for preventing back reflections into lasers that are coupled to optical fibers. The optical isolator is usually placed between the laser and optical fiber section used to transmit optical signals to a remote location.

Although many laser apparatus and photonic components that use optical fibers also make use of optical isolators in the form of Faraday rotators, similar componentry has been difficult to realize in planar lightwave circuits or photonic integrated circuits (PICs) that use planar waveguides. In particular, the Faraday rotator approach is difficult to realize using compatible processes with the fabrication of the PICs. This has created a need for optical isolators that can be integrated directly in planar lightwave circuits or PICs within optical chip carriers. The integrated optical isolators can prevent or reduce back reflections from waveguide components or waveguide sections that otherwise disrupt the integrity of the optical signals. Lasers are an important example of components that often require optical isolation to prevent excessive noise caused by unwanted reflections.

In addition, integrating lasers into planar lightwave or integrated photonic circuits can present additional difficulties in heat sinking and efficient optical coupling to a planar waveguide. This is especially true for planar lightwave circuits or PICs that use Si substrates and Si photonic waveguides, since the Si photonic waveguides usually include low refractive index materials such as oxides that limit heat flow.

Therefore needs exist for means to provide optical isolation as well as efficient heat sinking of lasers in integrated photonics and planar lightwave circuits, and for means of combining these with photonic waveguides.

In accordance with the foregoing, embodiments include an optical component that includes a branched optical isolator that may be integrated within an optical chip carrier, and an optical (i.e., typically laser) chip that may be integrated within the optical chip carrier to provide an optically isolated optical chip within the optical chip carrier through use of the branched optical isolator within the optical chip carrier. The optically isolated optical chip or waveguide section or component within the chip or PIC may provide for attenuated backscattering into an optical chip, or waveguide sections or components directly on the chip, assembled to a waveguide section of the branched optical isolator, since backscattered radiation may be preferentially directed towards an absorbing section of the branched optical isolator.

In a first instance, the optical chip carrier including the branched optical isolator may be readily fabricated using a silicon-on-insulator semiconductor substrate or PIC, in which the silicon on the insulator is used to form a planar optical waveguide. Alternatively the planar optical waveguide may be formed by an added material, such as SixNy, or other material with suitable refractive index to form the waveguide material. The branched optical isolator that is included within the optical chip carrier or PIC includes a branched structure where at least one of at least two branches, such as part of a Y-branch for example, comprises an optical absorber material and at least one of the at least two branches comprises an optical transmitter material. The branching may be achieved with other configurations besides a Y-branch (i.e., such as but not limited to: (1) a multimode interference section that includes three or more waveguide ports; or (2) a rectangular or other polygonal shape that includes straight waveguides), although the Y-branch is commonly used within optical chip carriers or PICs. The optical chip carrier or PIC also includes a location to which the optical chip may be assembled. Such a location provides for a heat sink to a base semiconductor substrate which may be a silicon-on-insulator semiconductor substrate that comprises the optical chip carrier, or another suitable substrate material such as a III-V semiconductor. Other substrate materials are also possible, including those that may include polymers or organic material waveguides.

Within the context of the embodiments as illustrated below, a "branched" shape for an optical isolator is typically but not necessarily intended as including a curvature in at least one branch within at least two branches within the optical isolator in accordance with the embodiments. In the case of a multimode interference section in particular, a curvature is not needed. Such a curved shape provides an acute expanding angle between the curved branch and at least one other branch within the branched shape optical isolator. Typically, and as illustrated in further detail below, the acute expanding angle is interposed between the curved branch that comprises an optically transmitting material and another branch (which may be curved or straight) that comprises an optically absorbing material, where both branches are connected to a trunk at a junction location.

An optical component in accordance with the embodiments includes a substrate. This particular optical component also includes an optical isolator comprising a branched shape located over the substrate.

Another optical component in accordance with the embodiments includes a substrate. This other particular optical component also includes a branched shape optical isolator comprising at least two branches connected to a trunk at a junction location and located over the substrate, wherein: (1) at least one branch within the at least two branches comprises an optical absorber material; (2) at least one branch within the at least two branches comprise an optical transmitter material, and terminates over the substrate at an assembly location for an optical chip.

Yet another optical component in accordance with the embodiments includes a substrate. This other particular optical component also includes a branched shape optical isolator including at least two branches connected to a trunk at a junction location and located over the substrate, wherein: (1) at least one of the at least two branches comprises an optical absorber material; (2) at least one of the at least two branches comprises an optical transmitter material and terminates over the substrate with a vertical face at an assembly location for an optical chip. This other particular optical component also includes the optical chip assembled at the assembly location over the substrate.

An optical chip or PIC in accordance with the embodiments may include an optical output location at a sidewall of the optical chip and including a thermal conductor layer located upon a side of the optical chip opposite the substrate. Alternatively, the optical chip or PIC may use an optical signal that is constrained to the chip, such as transmitted from a source of the optical signal (a laser or light emitting diode) to an on-chip detector or receiver.

A method for fabricating an optical component in accordance with the embodiments includes etching a surface layer of a waveguide within a PIC to provide a branched shape structure comprising at least two branches connected to a trunk at a junction location. This particular method also includes modifying or adding a material to at least one branch component but not at least one other branch to provide an optical isolator. The modified or added material provides optical absorption.

Integration of a laser to the chip while providing adequate heat sinking to the laser is also described in accordance with the embodiments. In this case the laser should also be efficiently coupled to the waveguide, which requires optical alignment and mode matching between the laser and waveguide. The integrated laser can then also be efficiently coupled to the waveguide and efficiently heat sunk.

BRIEF DESCRIPTION OF THE DRAWINGS

The objects, features and advantages of the embodiments are understood within the context of the Detailed Description of the Embodiments, as set forth below. The Detailed Description of the Embodiments is understood within the context of the accompanying drawings, that form a material part of this disclosure, wherein:

FIG. 3 shows one in the form a Y-branch.

DETAILED DESCRIPTION OF THE EMBODIMENTS

The embodiments provide a branched optical isolator that may be included within a laser chip carrier or a PIC that may be used within the context of a laser chip or the PIC. Within the embodiments, the branched optical isolator includes at least two branches connected at a junction location, where at least one of the at least two branches includes an optically absorbing material and at least one of the at least two branches includes an optically transmitting material. As will be illustrated in greater detail below the connection of the two branches and the trunk at the junction location of the optical isolator may be a direct physical connection, or alternatively an optically coupled connection within the context of an appropriately sized gap.

By using such a branched structure for an optical isolator, a laser apparatus having a laser output may be attached to one of the branches that includes the optically transmitting waveguide material and laser output will travel through the other branch that also includes the optically transmitting waveguide material and lead to additional optical circuitry either on or off the chip. Under circumstances where backscattered laser radiation within the optically transmitting waveguide material may be influenced to travel through the at least one branch that includes the optically absorbing material rather than the optically transmitting waveguide material, the embodiments provide for avoidance of backscattering radiation from the additional optical circuitry into the laser apparatus. A similar scheme can be used to isolate other components or waveguide sections.

1. The Branched Optical Isolator

Figure 12A:
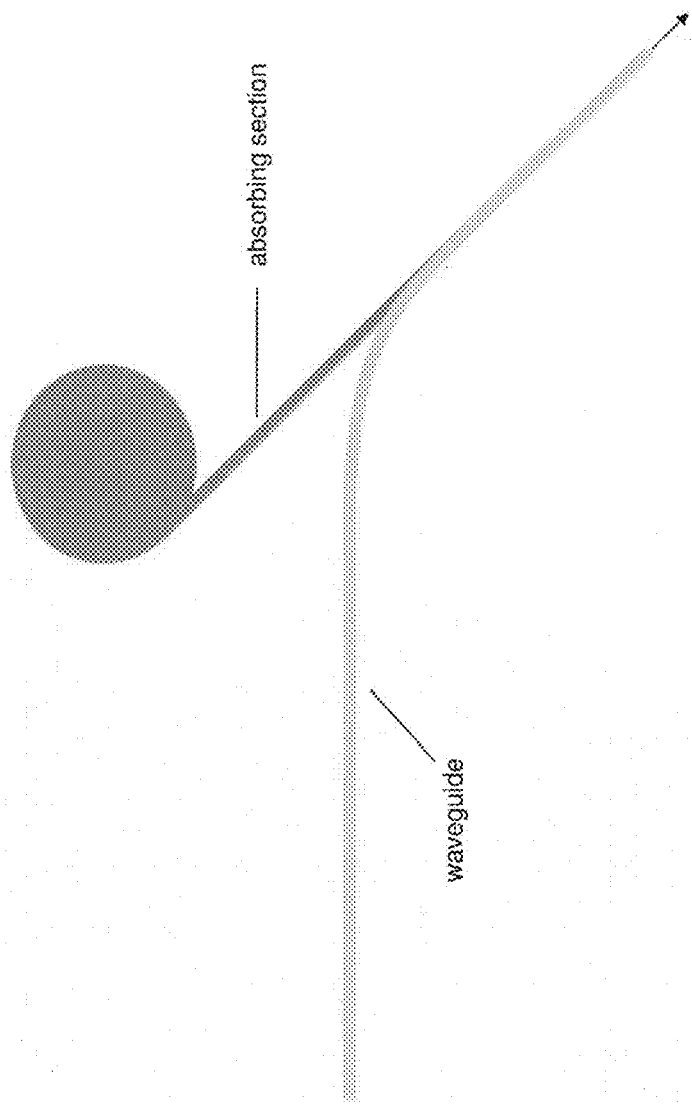
FIG. 12 (a)-(b) show two Y-branched optical isolators in accordance with the embodiments.
Figure 12B:
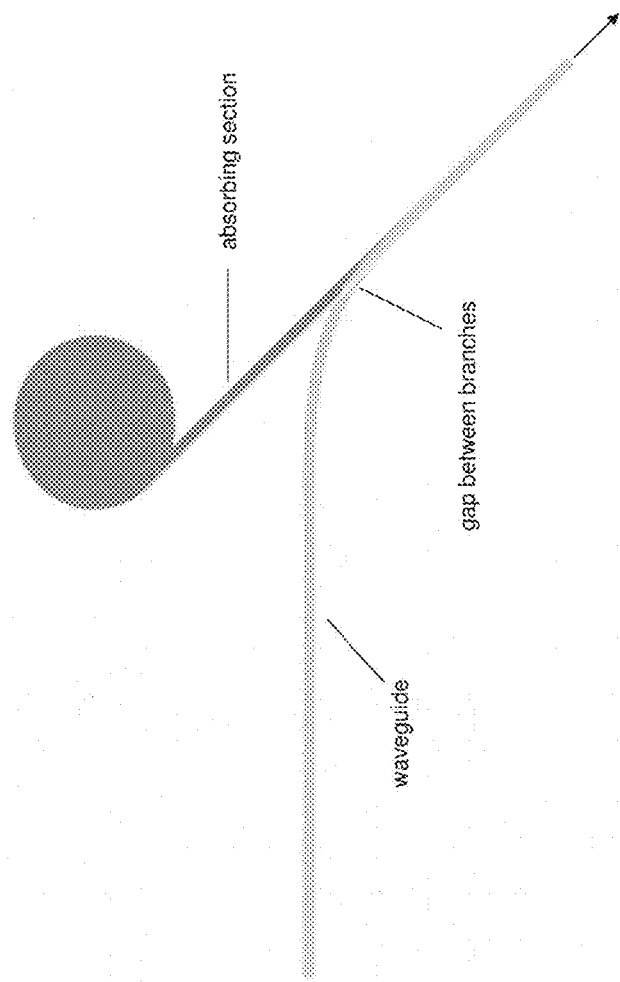

FIG. 12a and FIG. 12b show two schematic diagrams illustrating two embodiments of a branched optical isolator in accordance with the embodiments. In a first embodiment as illustrated in FIG. 12a, there is illustrated the branched optical isolator embodiment that includes an upper optically absorbing section and an upper optically transmitting waveguide section that are joined at a midpoint of the branched optical isolator and lead through the bottom optically transmitting waveguide section of the branched optical isolator to additional circuitry as indicated by the arrow at the bottom of the branched optical isolator. Within the schematic diagram of FIG. 12a, and although not illustrated, an optical chip (i.e., in particular a laser chip) is intended as attached to the distal left hand end of the optically transparent waveguide section. Within the schematic diagram of FIG. 12a, and as is illustrated, the optically absorbing section terminates in a nodal portion to which is tangentially attached the optically absorbing section.

Within FIG. 12a, both the optically transmitting waveguide section and the optically absorbing section may comprise a monocrystalline silicon material, but in order to provide the absorbing characteristics to the optically absorbing section, the optically absorbing section is typically amorphized through ion implantation with a dose of amorphizing ions to provide a concentration of amorphizing atoms within the optically absorbing section at a concentration from about $10^{19}$ to about $10^{22}$ amorphizing atoms per cubic centimeter. Amorphizing atoms may include, but are not necessarily limited to germanium and tin amorphizing atoms.

Another means of forming the absorbing section is through growth or deposition of a second material that can be processed into a waveguide. The optically transmitting section, for example, may be $Si_xN_y$, while the optically absorbing section may be deposited Si or Ge, or some heavily doped material.

Within FIG. 12a, typically, the optically transmitting waveguide section and the optically absorbing section each has a width from about 1 to about 20 microns and a thickness from about 0.5 to about 5 microns. The optically transparent waveguide section will typically have a length from about 0.01 to about 5 millimeters and the optically absorbing section will typically have a length from about 0.05 to about 1 millimeters. Finally, the nodal portion of the optically absorbing section typically has a length from about 0.0005 to about 1 millimeters.

Other means of achieving the branching configuration are also possible. As enumerated above, these may include a multimode interference filter, for example. The key issue here is that branching is used so that optical signals that may be back reflected in the optical transmitting section, for example those coming from modulators or other photonic components placed on or off the chip, have a return path that reduces the strength of these back reflections entering the optical waveguide section or components that are desired to be optically isolated.

Within the second embodiment of the branched optical isolator in accordance with the embodiments as illustrated in FIG. 12b, there is added a gap interposed between the optically transparent upper waveguide section and the optically transparent lower waveguide section. The gap has a width from about 0.0001 to about 1 microns. The gap can provide greater isolation while also providing efficient coupling into the optical transmitting section.

Figure 13:
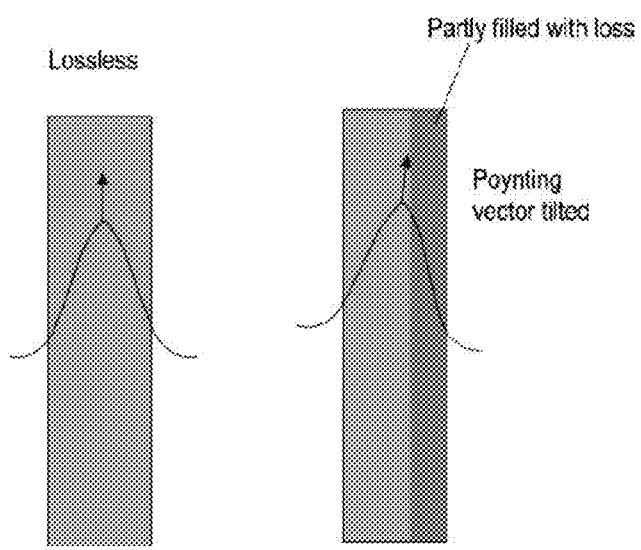
FIG. 13 shows a comparison of propagating waves and Poynting vectors in a lossless straight waveguide on the left, or a waveguide partially filled with absorbing material on the right. The absorbing material causes a tilt in the Poynting vector directing the wave towards the absorbing region.

FIG. 13 on the left shows a straight lossless waveguide with a confined mode propagating down the guide. The Poynting vector points along the normal to the guide giving the direction of energy flow. On the right is shown the propagation for the same guide filled partly with loss material. The result is that the Poynting vector is directed towards the lossy region. The reason is that the energy flow is into the loss region due to absorption, and this is shown by the tilt in the Poynting vector. If the direction were reversed the Poynting vector would again be pointed into the loss region, breaking the inversion symmetry.

In the case of the absorbing optical isolator using a branch in the guide, the field propagating away from the laser or into the branching optical isolator necessarily experiences some absorption, but follows the curved waveguide for the most part (FIG. 12). Some energy will be lost due to absorption, and some reflection will also occur due to the discontinuity in the guide. However the loss experienced by the wave returning to the laser will be much greater. Much of the returning wave will be directed into the absorbing part of the Y-branch where it can be captured in the absorbing disk to dissipate its energy. This difference in propagation behavior provides the isolation.

2. Overview of Components

Ultralow noise semiconductor lasers that operate at high power or in mode locking operation can be realized by stabilizing the laser optical output using external cavity feedback formed in the waveguide of the PIC, and combining electronic feedback to further control the laser frequency and phase noise. For example, the mode-locked laser may be used for wavelength division multiplexing or optical waveform generation. The embodiments are intended to illustrate that PICs can offer routes to RF photonic lasers or lasers for communication that are compact and low cost. With the addition of electronic control circuitry, it may be possible to exceed the performance of semiconductor lasers coupled to fiber optic components, such as III-V gain chips coupled to external cavity fiber Bragg gratings (FBGs). These results with III-V coupled to FBGs include a 2 kHz linewidth, −160 dB/Hz noise floor, and 370 mW power at 16 C. The advantages of PICs to exceed these values comes from the unique processing and integration that can take full advantage of semiconductor processing.

The embodiments propose a route to integrate a III-V laser chip to sit directly on the SiO$_2$ of the SOI, with near perfect mode matching to a SOI reflector and waveguide. Butt coupling can be greatly improved over FBGs because a very small gap (<10 nm) appears possible that minimizes unwanted reflections. The III-V chip design is relevant. It should use its own low loss III-V waveguide to produce high power, but otherwise can be GaAs or InP-based, or even another suitable semiconductor laser material, to cover different wavelengths. The integration of the laser on the PIC with efficient coupling between the laser and waveguide components is an important step. The SOI for example provides a highly engineerable silicon Bragg grating (SBG) reflector for single mode selectivity and high reflectivity to the external laser cavity to produce high side mode suppression ratio (SMSR). Powers can be in the 100's of milliwatts to watts because of the III-V design. The branched optical isolator is described to reduce unwanted reflections into the laser cavity. The heterogeneous integration can produce CW, pulsed, or mode locked lasers.

The laser may be initially fabricated on its own III-V substrate material using either p-doped substrate or n-doped substrate material. However a critical component is the mode matching between the semiconductor laser waveguide and planar waveguide of the PIC. By mode matching and use of a broadened waveguide over the typical telecommunication design, the power from the laser can be increased by increasing the laser cavity length while maintaining low operating power density and efficient heat sinking. The embodiments below describe fabrication and mounting of III-V lasers initially fabricated on their own III-V p-doped substrate. An SixOy layer is used as a vertical alignment guide, and heat sinking is achieved through etched vias to the thermally conducting PIC substrate (for example, Si).

The mounting and alignment may also be achieved using an n-doped substrate and thin solder to achieve alignment to the planar waveguide of the PIC. In this case the SixOy may also be removed to further enhance heat sinking at the possible expense of some loss in optical alignment tolerance.

In order to operate efficiently with high power, the laser should have low internal optical loss to prevent absorption of its own internal laser light. This can be achieved by designing the laser to have low internal optical loss. By using its own III-V laser material as the waveguide section in the laser cavity, this can be achieved by reducing the optical overlap of the internal laser field with electron and hole charge. Therefore high optical coupling efficiency and low internal optical loss are possible with the schemes described here for integrating lasers into PICs.

Figure 1:
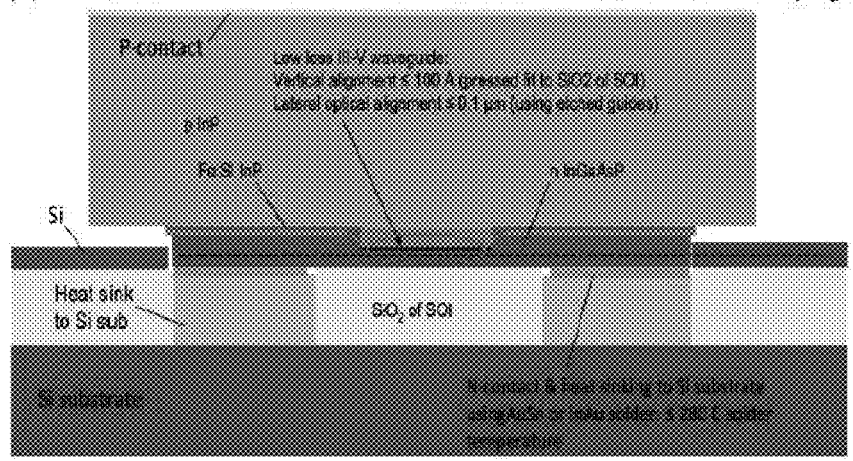
FIG. 1 (a) shows an end view of an integrated III-V laser chip upon a SOI chip carrier in accordance with the embodiments. Plated Au vias are used to heat sink to the Si substrate. (b) Shows optical mode field profiles along the III-V and Si waveguides. Alignment guides are designed to reduce the butt coupled gap to <100 Å, and an angled stripe reduces back reflections. Close mode matching is achieved between III-V and Si waveguides. (c) Shows an alternative related art technique of wafer fusion for comparison. Mode matching is not possible for this related art approach. Gain coupling, injection efficiency, and heat sinking suffer due to prior art wafer fusion.
Figure 1:
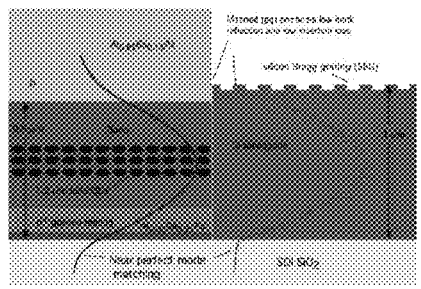
Figure 1:
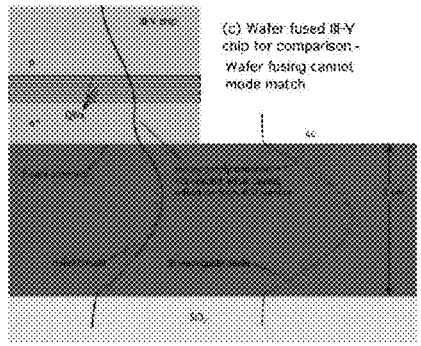

FIG. 1 (a) shows an end-on view of the integration scheme for an InP-based buried heterostructure (BH) chip design. Sitting the laser directly on the SiO$_2$ of the SOI can produce near-perfect vertical alignment. The III-V waveguide requires low internal loss and mode matching to the planar waveguide of the PIC to deliver high optical power. Heat sinking to the PIC substrate can be achieved using large area Au plated vias that also make n-side contact to the chip. These two features make possible the 100 mW and greater power from the III-V laser. The lateral alignment can also be precise. The III-V can be laterally aligned to an adiabatically coupled SBG using guides in the SOI platform as shown in FIG. 1 (a). Lateral precision <0.1 μm is expected in full development.

FIG. 1 (b) shows how mode matching becomes possible using the separate III-V and Si waveguides with SiO$_2$ placement. This time a GaAs-based QD chip is considered. By properly adjusting the III-V layer thicknesses, the mounting scheme and chip design can produce optical matching between the III-V and Si exceeding 97% overlap. It is believed that the gap shown between the III-V and SBG can be reduced to <10 nm. At this size the gap produces minimal reflection and provides constructive feedback as part of the SBG. The mode matched III-V/Si waveguide places a lower limit on III-V insertion loss to the SOI platform of ~0.1 dB.

FIG. 1 (c) is intended to illustrate why alternative wafer fusing cannot achieve the same laser performance as butt connected components in accordance with the embodiments. A problem is that the evanescent tail in the III-V prevents mode matching to the Si waveguide, and produces poor gain overlap and low injection efficiency. Mode overlap is only ~50% between the III-V wafer fused region and the Si waveguide outside the chip. The 50% overlap puts a lower limit of ~3 dB on insertion loss per end, while 5.3 dB insertion loss has been demonstrated. The wafer fused interface and heavy III-V doping needed for injection further combine to produce high internal waveguide loss of ~15 cm$^{-1}$. This is too high to achieve high single mode power. The optical gain also suffers due to poor optical overlap. Inability to mode match, high internal waveguide loss, poor injection efficiency, and poor gain overlap all lead to self-heating in the already temperature sensitive InP-based optical gain chip with wafer fusing. Low loss can only be achieved if the lower part of the waveguide (FIG. 1 (b)) uses n-type material. This requires growth on a p-type substrate, flip-chip mounting with SiO$_2$ placement, and minimal gap to the SBG. The design is to deliver between 200 and 500 mW single mode power to the Si photonic circuitry (depending on the wavelength).

Optical isolation of the laser chip is also important to prevent unwanted reflections back into the laser chip. The optical isolation can be achieved using the above described branching optical isolator.

Figure 2:
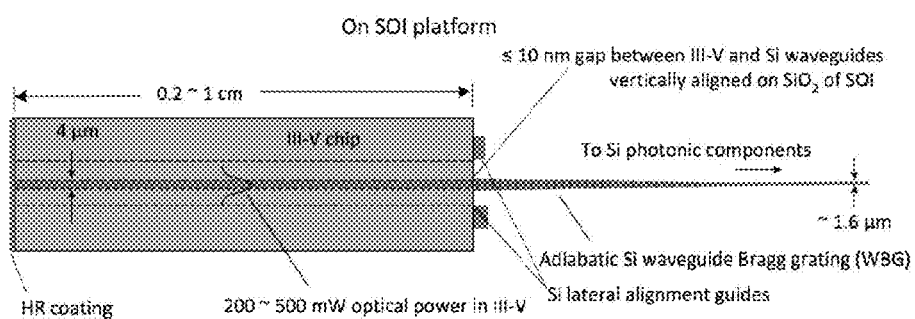
FIG. 2 shows a top view schematic of the integration of a III-V laser chip with a Si waveguide Bragg grating (WBG) in accordance with the embodiments. The Si WBG is based on adiabatic coupling in the lateral direction, and precise vertical alignment using the SOI's $SiO_2$. Semiconductor processing enables the Si WBG to be designed with much greater flexibility than a fiber Bragg grating to produce very low SMSR in the laser chip. The SOI processing also enables the gap between the III-V and Si waveguide to be made exceedingly small (</=10 nm). Optical mode matching between the III-V and Si combined with lithography can be used to reduce unwanted reflectivity from butt coupling the waveguides.

FIG. 2 shows a top view illustrating the integration of the III-V to the adiabatically coupled SBG. Basic features are known from past external cavity work using III-V gain chips, but the PIC integration offers some major advantages because of the PIC and III-V processing. The SOI approach to the PIC can be attractive because it can also provide integration of electronic control circuitry. The gap minimization between the III-V and SBG must be emphasized. The III-V chip can be slid up to butt a cleaved facet to an etched end of the SBG, through use of Si lateral alignment guides, each of which serves as a registration guide. Once this gap becomes less than ~λ/10 reflectivity from the gap is minimized The SBG can be engineered to possibly produce a much greater SMSR than with an FBG. Based on a 4 μm single transverse mode waveguide and 1 cm gain path, this enables the III-V chip to deliver ~500 mW or more of optical power to integrated PIC photonic components. The long cavity III-V and high reflectivity from the SMSR designed for narrow bandwidth combine to project a passive cavity quality factor of Q >5×10$^6$ assuming 99% reflectivity from the Si WBG. Using a shallow etch in the WBG can produce the spectrally narrow stop-band needed for high SMSR.

Figure 3:
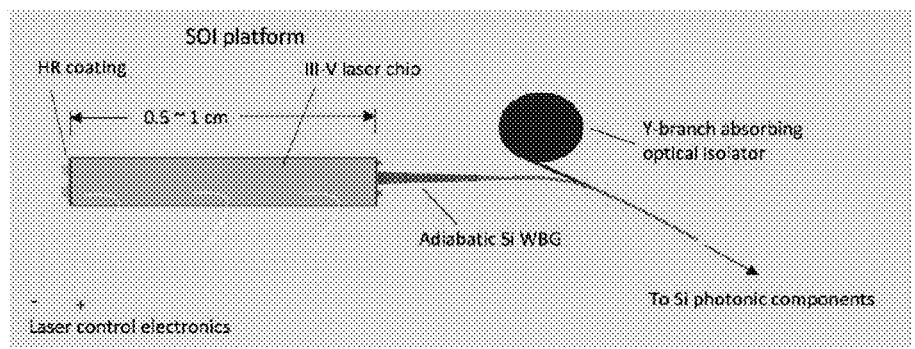
FIG. 3 shows a schematic overview of the external cavity laser including a branching absorbing optical isolator and wire bonding and chip leads to the III-V chip in accordance with the embodiments. Other configurations of the branching sections are also possible.

FIG. 3 shows the Si photonic laser integrated with the absorbing Y-branched optical isolator. More details of the optical isolator are described above. Absorption is created in the dark blue region by selective implanting a high dose of Ge or another impurity, or other means for creating the absorbing section. Only low temperature annealing (i.e., at a temperature from about 100 to about 400 C. for a time period from about 5 to about 300 minutes) if any is required, and crystal defects are not an issue for the absorber. An optical wave leaving the external cavity laser follows the bend to additional PIC photonic circuitry. Reflected waves returning to the laser follow the absorbing waveguide into the absorbing region where they dissipate their energy. An important point is the influence of the absorption on the Poynting vector of the wave propagating in either direction. The absorption causes the Poynting vector to tilt slightly towards the absorbing waveguide, making this propagation direction more heavily favored for the wave propagating towards the laser, as opposed to away from it. In this case the inversion symmetry in the propagation paths is broken by the branch and optical absorption. This breaking of inversion symmetry is a requirement of optical isolation in accordance with the embodiments.

The FIG. 3 components can be compared with those used to achieve improved RF noise properties from a semiconductor gain chip. A slab coupled optical waveguide amplifier is replaced with the III-V gain chip that produces equally low internal optical loss, but with a waveguide design to match the PIC planar waveguide. The FBG of the external cavity is replaced with the PIC SBG, with the integration potentially reducing insertion loss because of the butt coupling based on the extremely narrow gap <10 nm that can be achieved. With this small gap it is believed that an angled stripe is not necessary, and waveguide and insertion loss should actually be reduced.

3. GaAs-Laser Chip and PIC Mounting

Figure 4:
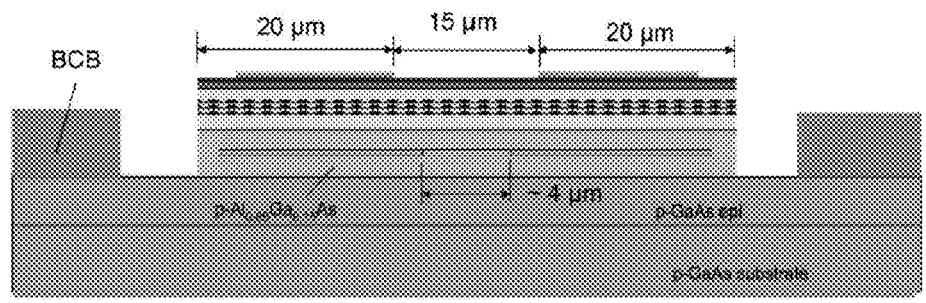
FIG. 4 shows a schematic illustration of a cross section of a GaAs QD chip in accordance with the embodiments. The QDs can emit in a range of 1.1 to 1.3 µm.

GaAs laser chips in accordance with the embodiments can be fabricated based on selective oxidation, a ridge waveguide, or buried heterostructure, while InP laser chips are intended to use a ridge waveguide or buried heterostructure. These are described in greater detail below. It is important that in each case the III-V can be grown on p-type substrates in order to form low loss III-V waveguides and alignment using an SixOy layer of a PIC. FIG. 4 shows the selectively oxidized GaAs chip for the 1.3 µm QD gain material. Two n-type metal stripes are used on the epitaxial side that will make contact to the SOI heat conducting vias. These also serve as the n-side contacts. The sidewall oxidation is self-aligned to deeply etched mesa sidewalls and laterally opposite the BCB layers. The p-type GaAs substrate is thinned and metalized, and BCB is softbaked and patterned, but not hard baked. The soft BCB will be used when the III-V chip is mounted to the SOI platform. The III-V lasers are fully testable in cleaved facet form as shown in FIG. 4.

Figure 5:
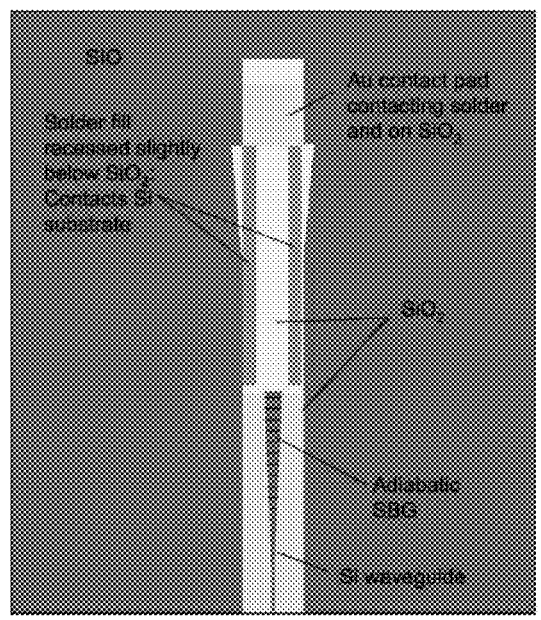
FIG. 5 shows a schematic diagram of a SOI platform that will contain a III-V chip in accordance with the embodiments. Shown are the Si waveguide, the SBG that connects the III-V and Si waveguide, the solder metallization to contact the n-side (epi-side) of the III-V, and a Au contact pad that sits on the $SiO_2$ but contacts the solder metallization.

The PIC platform, in this case an SOI, without the III-V chip is shown in FIG. 5. Only the adiabatic waveguide coupling region (the SBG), recessed region for the chip, solder regions, and n-metal contact are shown. FIG. 5 is described in reference to a Si planar waveguide, but SixNy or other planar waveguide material may also be used. The III-V chip is designed to finally sit directly on the exposed SiO₂ in between the solder fills. The solder fills contact the Si substrate of the SOI. The top Si layer is used both for the waveguide and lateral alignment guide (i.e., registration guide) to place the chip. A flared region is shown in the top. Non-limiting exemplary embodiments include: Si layer where the III-V will sit, and this flared region will be used to guide the chip forward and into place contacting the SBG of the Si waveguide. Thus the recess including the flared region is also intended as an alignment guide (i.e., a registration guide). The aspect ratios are important and FIG. 5 is not to accurate scale. The width of the SiO₂ region where the chip will sit is as close to tolerance allows to the width of the III-V mesa shown in FIG. 4 above. If the width of the Si opening where the chip sits is 46 µm, this would allow a 1 µm lateral position variation in positioning the III-V chip. Because of the precision with which the III-V and Si can be etched it is believed the tolerance can actually be much better than this and <0.5 µm. Note that the Si waveguide needs not be deeply etched, but the region where the III-V will sit must be the exposed SiO₂.

It is important that the recessed region for the III-V allows the chip to be put into place and slid forward to contact the Si waveguide, or in the case of FIG. 5 the SBG. The III-V stripe width needs to be ~4 µm or less to maintain a single transverse mode. One may estimate that the adiabatic waveguide can be ~5 µm in width, which will ultimately taper laterally to the width of the Si waveguide (<2 µm). The design should be such that the III-V chip can be moved fully forward until it contacts the Si waveguide or SBG, which stops it. Because of the length of the chip, which is between 2 mm and 1 cm depending on the active design, the angular range away from normal will be <0.02°. Thus the cleaved facet of the III-V can sit flush against the Si waveguide or SBG etched edge.

Figure 6:
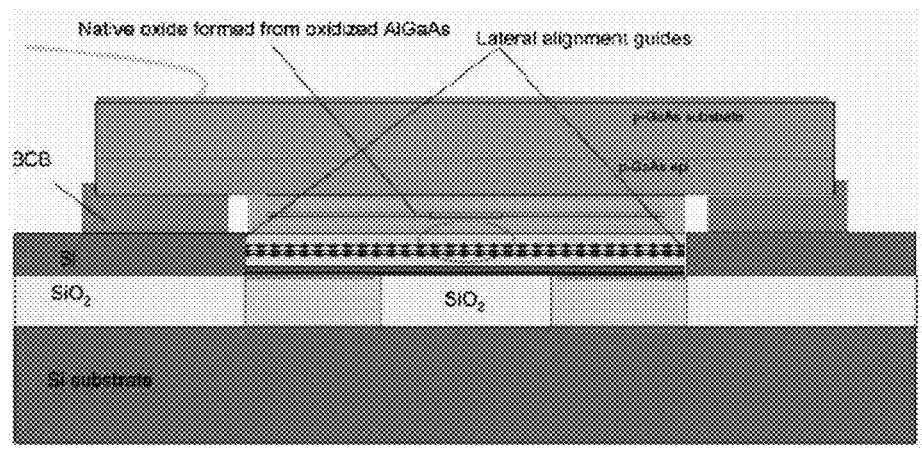
FIG. 6 shows an end view of the III-V QD chip mounted on the SOI platform $SiO_2$ in accordance with the embodiments.

FIG. 6 shows the end view of the III-V chip mounted on the SOI. The QD waveguide design is described below and matches the Si waveguide in its optical mode. The lateral alignment due to the III-V mesa is shown. The selective oxidation is used to confine the mode and the injected current. Because it proceeds from the same mesa edge used to align the chip the oxide opening is self-aligned to the Si waveguide. When the chip is soldered, the solder and metal on the chip need to be of sufficient thickness so that the III-V chip metallization sinks into the solder as the solder melts. The soft BCB along the chip edge is used for support. It is designed to be compressed into SOI to add support as the chip is pushed into the molten solder until the III-V waveguide fully contacts and comes to sit on the SiO₂ as shown.

The design of the integration is not made for small III-V chips, but large chips that can supply high power to the SOI external cavity laser. High power is a key requirement for low noise, and the III-V chip design is critical to achieve this. Depending on the internal loss of the III-V waveguide, it can supply anywhere from ~200 mW at 1.55 possibly up to 1 W or more of power at 1.15 µm. This depends on the temperature of the Si substrate. Heat sinking to the Si is expected to be better than for epi-side up testing.

Figure 7:
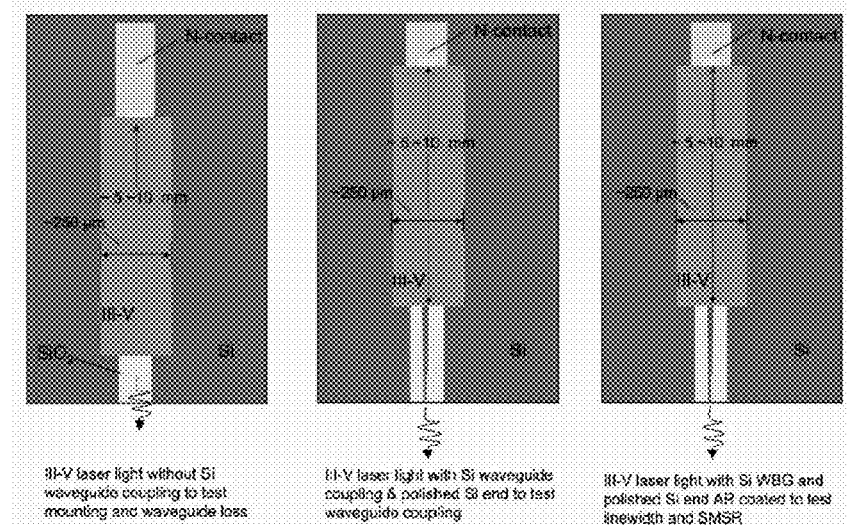
FIG. 7 shows different top views of different configurations that may be used to test the SOI mountings in accordance with the embodiments. On the left the output of the III-V can be measured directly after mounting without Si waveguide coupling. In the middle the adiabatically tapered waveguide can be compared to determine the coupling loss. On the right the SBG can be used to measure the influence on spectral emission and coupling loss. For the waveguide coupling the Si end of the waveguide can be polished and AR coated.

FIG. 7 shows different examples of the mounting that can be used with the mounting described above, as well as directly integrated into a PIC with additional photonic components. On the left is shown simply the III-V chip mounted on the SOI platform. The III-V laser emission will be directed out the cleaved facet and can be tested and compared with that measured directly on the III-V chip before mounting. In the middle shows coupling to an adiabatic Si waveguide. This can be used to test the coupling efficiency to the waveguide and compare to the case on the left. On the right is shown the case for coupling to the SBG. For the different cases the characterization of the mounting, the waveguide coupling, and the SBG influence can be tested. The SBG can be designed to produce single longitudinal mode operation, and high cavity quality factor. The design of the SBG becomes of interest because it could enable greater transverse mode control than for a single FBG. This could become a significant advantage for Si photonic external cavity lasers. Curved wavefronts can be envisioned, or chirped gratings to provide greater spectral control and larger SMSR. Because the design of the SBG is lithographic its available parameter space is large. However the SBG is not a central focus of the research, which is instead the ability to precisely integrate the III-V with the SBG. For testing, the Si waveguide output end can be polished and antireflection coated. In each case the semiconductor laser can be combined with electronic control circuitry to provide electronic feedback and low noise.

The SOI processing includes the lithography, wet etching, and dry etching, as well as deposition of various materials, needed to fabricate the SOI platform as shown in FIG. 5. The adiabatic waveguide and adiabatic SBG can be designed using optical simulation and fabricated in different forms. The processing can use deep selective etching through the Si and $SiO_2$ layers followed by metallization and lift-off. High conductivity metals of including Cr, Ti, or other metals for adhesion and Ag, Au, or other less reactive and high thermal conductivity metals to fill the etched regions in the $SiO_2$ for the heat sink vias can be performed using electron beam deposition, followed by a thin layer of similar metals. In some cases it may be desirable to use metals such as Ta or Mo that can be combined to thermally match the semiconductor expansion coefficient.

A soldering process temperature can be ~280 C to protect any electronic circuitry that exists on the PIC. Some care must be taken to avoid unstable phases of the AuSn but these solder recipes are well established. Very smooth solder layers can be achieved when the starting substrate is also smooth, such as for the SOI. When the solder melts the III-V chip will compress into the $SiO_2$ platform left between the two solder regions shown in FIG. 5.

4. Influence of the Gap

Figure 8:
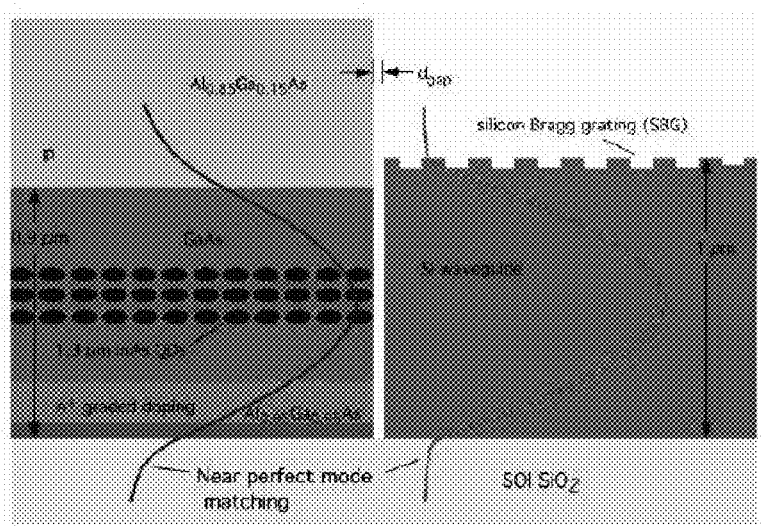
FIG. 8 shows a side view of the gap that will remain between the III-V and Si waveguides in accordance with the embodiments. The III-V will be a cleaved facet, while the Si waveguide end will be dry etched. The actual gap can be extremely small and estimated to be </=10 nm.

The gap between the III-V and Si waveguides is illustrated in FIG. 8. This gap is expected to be extremely small and on the order of 10 nm or less. The reflectivity from the gap can be considered from knowing that a gap of a quarter wavelength, or 337 nm, will produce a maximum reflectivity of ~60% based on III-V/air/Si indexes. As the gap is made smaller the reflectivity decreases. The gap size of 10 nm corresponds to 0.008 wavelengths for 1.3 µm. This gap is fixed in position by the etched end of the Si waveguide. Therefore it actually becomes part of the SBG reflector.

This is a much different case than for coupling a laser diode to an optical fiber for which the gap is typically at least a few microns. The optical wave has no distance to diffract when transferring between the guides. It is believed that this could be an unforeseen strength of the Si photonic processing and this particular integration scheme. It creates an optical coupling that appears to be lower optical loss than even achieved with the SCOWA mode coupling to an FBG, which has produced the best noise characteristics yet for III-Vs in external cavities. The reflectivity from the gap can be tested by using the middle structure of FIG. 7 and examining the coupled cavity effects on the longitudinal mode spectrum. When combined with the SBG one may not expect the gap to reduce optical coupling, which we expect to be more heavily influenced by lateral alignment and mode matching.

Figure 9:
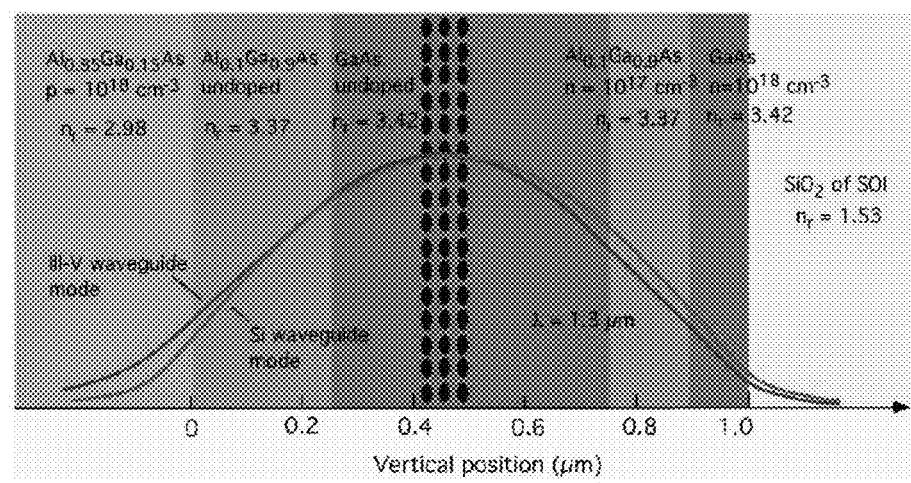
FIG. 9 shows a plot showing design of III-V waveguide and field overlap with Si waveguide mode in accordance with the embodiments. The waveguides and their fields are aligned using the $SiO_2$ layer of the SOI.
Figure 10A:
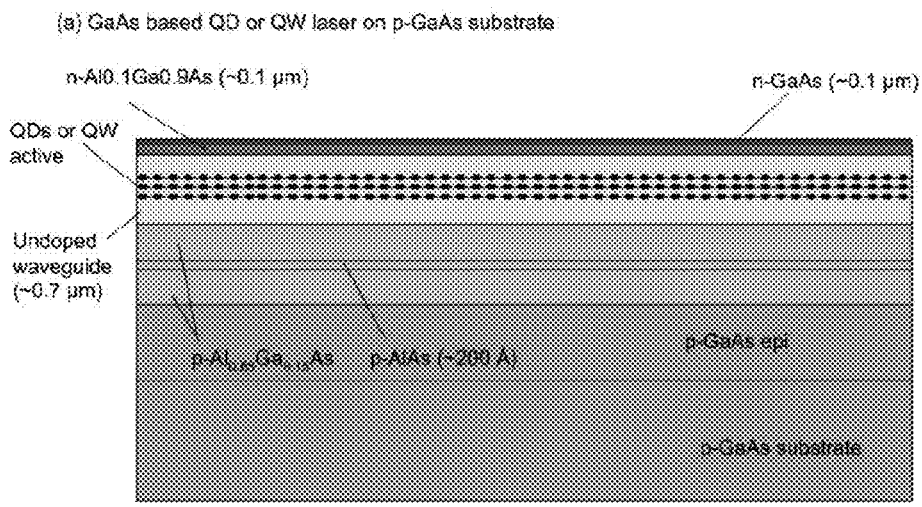
FIGS. 10 (a)-(g) show the details of the fabrication and integration schemes for a GaAs-based QD or QW gain chip in accordance with the embodiments.
Figure 10B:
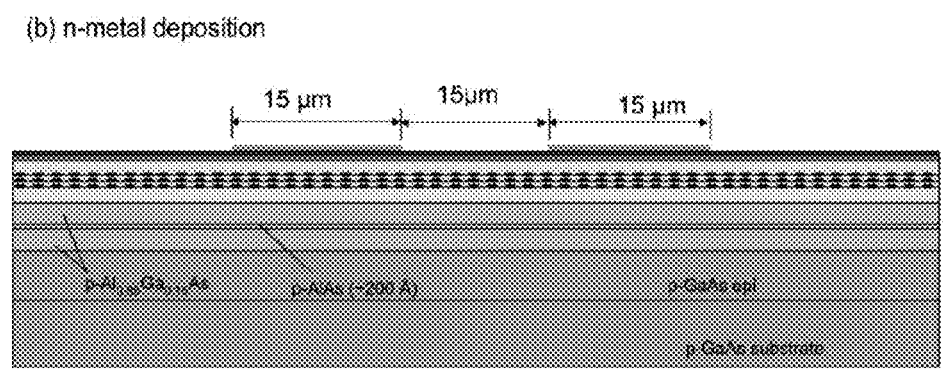
Figure 10C:
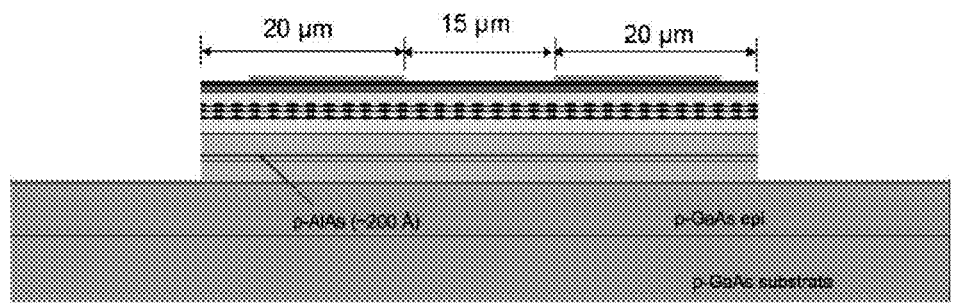
Figure 10D:
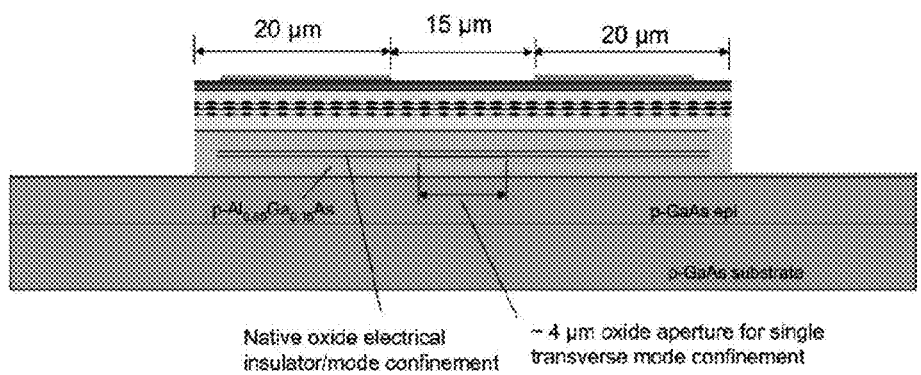
Figure 10E:
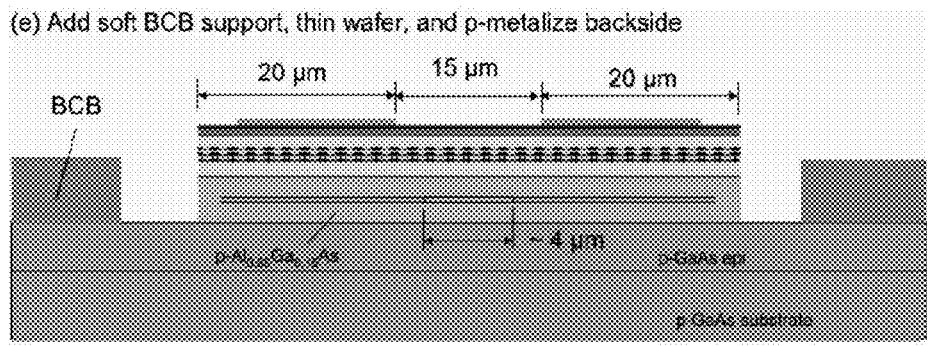
Figure 10F:
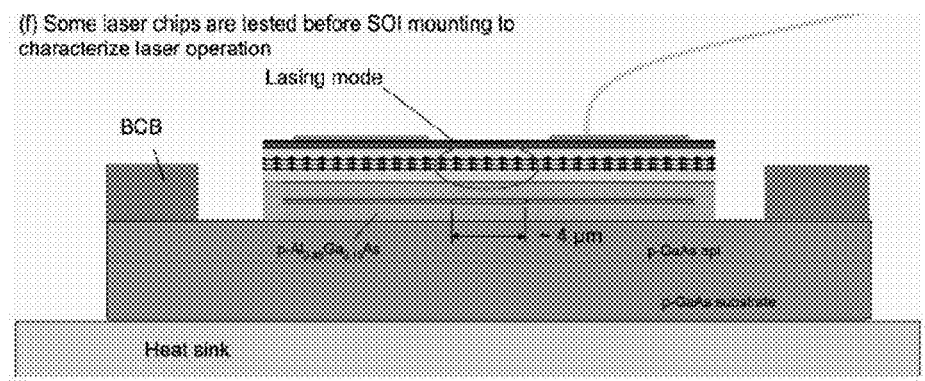
Figure 10G:
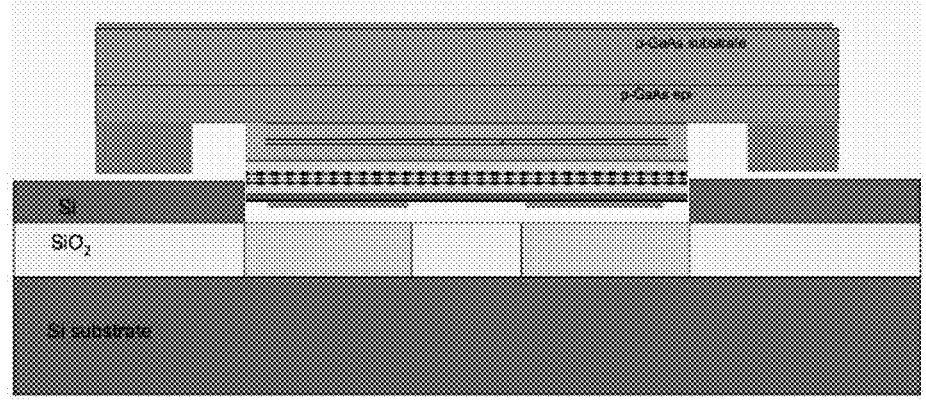

5. III-V Waveguide Design Using P-Type Substrates and Si Waveguide Mode Matching FIG. 9 shows the details of the III-V waveguide design for GaAs-based QDs used to match the Si waveguide mode. One designated curve is the simulated mode profile in the Si waveguide, and another designated curve is the simulated mode profile in the III-V. One may observe that using this technique the Si and III-V waveguides can be matched for fairly wide range of Si waveguide heights. The $SiO_2$ establishes vertical alignment of the two waveguides and their optical fields. Internal loss of the III-V waveguide is given below. The case for GaAs-based InGaAs QWs and the InP BH follow a similar design approach. The III-V waveguide contains one higher order mode with an antinode in the waveguide center. By placing the 3 QD or single QW gain region at the mode center the lowest order mode can be selected for laser operation. The design is similar to that used for high power broad area laser diodes and high power laser diodes with single transverse mode operation. The broadened waveguide with only small overlap to the confinement layer is critical for low optical loss.

The internal loss of the waveguide plays the central role in determining the optical power that can be extracted from the III-V chip. It also partly establishes the differential slope efficiency, $\eta_{Diff}$. Considering the insertion loss that comes from the integration to the SBG, $$\eta_{Diff}(T) = \eta_{inj}(T) \frac{\ln(1/R_{SBG})}{\ln(1/R_{SBG}) + \ln(1/R_B) + 2\ln(1/T_{Insert}) + 2\alpha_{III-V}(T)L_{III-V}} \quad (1)$$

where $\eta_{inj(T)}$ is the temperature dependent injection efficiency of the III-V gain material, $R_{SBG}$ is the reflectivity of SBG, $R_B$ is the back minor reflectivity of the III-V chip, $T_{Insert}$ is the single pass transmission related to the insertion loss of the III-V chip (for no insertion loss $T_{Insert}=1$), $a_{III-V(T)}$ is the internal loss of the III-V waveguide, and $L_{III-V}$ is the gain length of the III-V chip. The optical power that can be delivered from the chip is given by $$P_o = \eta_{Diff}(T)W_{III-V}L_{III-V}(J - J_{Th}(T)) = \frac{\ln(1/R_{SBG})\eta_{inj}(T)W_{III-V}L_{III-V}(J - J_{Th}(T))}{\ln(1/R_{SBG}) + \ln(1/R_B) + 2\ln(1/T_{Insert}) + 2\alpha_{III-V}(T)L_{III-V}} \quad (2)$$

where $W_{III-V}$ is the stripe width, J is the operating current density, and $J_{Th(T)}$ is the temperature different threshold current density.

The stripe width $W_{III-V}$ is essentially fixed to be ~4 µm or less for single transverse mode operation, and the operating current density is essentially limited to J ~5000 A/cm$^2$ before self-heating degrades the III-V performance. The optical power that can be delivered by the III-V chip to the external cavity laser of the SOI then becomes critically dependent on the III-V gain length $L_{III-V}$ which in turn is set by the internal waveguide loss $a_{III-V(T)}$. Note that the internal waveguide loss plays a larger role than even the insertion loss. Even if the insertion loss is large the power delivered by the III-V chip can be increased by increasing the gain length. However if the internal optical loss is too large relative to the cavity length increasing the cavity length simply increases the III-V chip heating.

Table I shows a waveguide simulation for a GaAs QW with waveguide design similar to the QD gain region. The simulation shows that this waveguide design is capable of very low internal loss and therefore capable of high single mode power. The simulation uses the layer thicknesses and refractive index, doping, a single QW placement, mode confinements in different layers, and optical losses for free carrier absorption.

TABLE 1

|  | GAMMA | thickness um | n (cm-3) | p (cm-3) | _WG | _Total(cm-1) |
|---|---|---|---|---|---|---|
| 85% AlGaAs | 0.00% | 0.1 | 2.44E−15 | 1.00E+18 | 1.12E−04 | 3.23E−01 |
|  | 0.01% | 0.1 | 3.60E−15 | 1.00E+18 | 5.04E−04 |  |
|  | 0.03% | 0.1 | 3.60E−15 | 1.00E+18 | 2.28E−03 |  |
|  | 0.15% | 0.1 | 3.60E−15 | 1.00E+18 | 1.03E−02 |  |
|  | 0.67% | 0.1 | 7.24E−11 | 8.67E+17 | 4.03E−02 |  |
| 10% AlGaAs | 0.92% | 0.05 | 2.29E−06 | 2.20E+17 | 1.41E−02 |  |
|  | 1.58% | 0.05 | 8.54E−05 | 1.33E+15 | 1.47E−04 |  |
|  | 2.42% | 0.05 | 2.68E−03 | 4.15E+13 | 7.04E−06 |  |
|  | 3.44% | 0.05 | 8.36E−02 | 1.33E+12 | 3.20E−07 |  |
|  | 4.62% | 0.05 | 5.42E+00 | 4.32E+10 | 1.40E−08 |  |
| GaAs | 5.53% | 0.047 | 1.10E+03 | 1.06E+10 | 4.12E−09 |  |
|  | 7.06% | 0.05 | 3.02E+04 | 4.28E+08 | 2.11E−10 |  |
|  | 8.05% | 0.05 | 8.71E+05 | 1.48E+07 | 8.57E−12 |  |
|  | 8.73% | 0.05 | 2.51E+07 | 5.14E+05 | 6.89E−12 |  |
|  | 9.04% | 0.05 | 7.12E+09 | 1.81E+04 | 1.93E−09 |  |
| QW | 1.09% | 0.006 | 1.70E+18 | 1.70E+18 | 1.85E−01 |  |
| GaAs | 8.40% | 0.047 | 2.67E+10 | 4.40E+02 | 6.74E−09 |  |
|  | 8.48% | 0.05 | 7.31E+11 | 1.77E+01 | 1.86E−07 |  |
|  | 7.66% | 0.05 | 2.11E+13 | 6.13E−01 | 4.84E−06 |  |
|  | 6.56% | 0.05 | 6.16E+14 | 2.12E−02 | 1.21E−04 |  |
|  | 5.28% | 0.05 | 2.39E+16 | 6.75E−04 | 3.79E−03 |  |
| 10% AlGaAs | 3.96% | 0.05 | 5.48E+16 | 1.22E−06 | 6.52E−03 |  |
|  | 2.80% | 0.05 | 9.76E+16 | 4.32E−07 | 8.19E−03 |  |
|  | 1.83% | 0.05 | 1.21E+17 | 4.48E−07 | 6.65E−03 |  |
| GaAs | 1.05% | 0.05 | 9.97E+17 | 2.46E−06 | 3.15E−02 |  |
|  | 0.47% | 0.05 | 1.00E+18 | 2.45E−06 | 1.41E−02 |  |
| SiO2 | 0.17% | NA | NA | NA | NA |  |

The single QW has about twice the free carrier loss of a high quality 3 QD gain region. The optical loss in each layer is shown in the second column from the right, and the total waveguide loss assuming electron-hole injection into the QW is shown on the far right at 0.32 cm$^{-1}$. This loss is consistent with broadened waveguide lasers. Note that most of the loss in Table I for the III-V waveguide comes from the active carriers in InGaAs QW which cause free carrier absorption. This makes up 0.19 cm$^{-1}$ loss of the 0.32 cm$^{-1}$ total. This loss comes in large part from the need to invert the QW. Because the QDs have much lower transparency carrier density the QD active material can produce much lower internal optical loss. The three InAs QD gain region can reduce the free carrier loss of the active region to ~0.05, and the estimated waveguide loss reduces to ~0.18 cm$^{-1}$. These waveguide losses can be compared with Table II. Mode matching directly to the Si waveguide therefore enables a broadened waveguide design capable of very low internal loss.

Table II illustrates design parameters for the III-V/Si integrated gain chips. Low internal optical loss to increase the gain path, and mode matching to the Si waveguide are the key design steps. The III-V chips using high efficiency injection designs based on selectively oxidized GaAs QW and QDs, and BH InP QWs.

TABLE II

| III-V gain technology | Wavelength | III-V waveguide loss | Gain length | Optical power* | Insertion loss | Heat sink (SCI) temperature |
|---|---|---|---|---|---|---|
| InP QW/buried heterostructure | 1.55 μm | <2 cm$^{-1}$ | ~5 mm | >200 mW | ≤0.2 dB | 25 C. |
| GaAs QD/ selective oxidation | 1.3 μm | <0.5 cm$^{-1}$ | ~10 mm | >100 mW | ≤0.2 dB | 30 C. |
| GaAs QW/ selective oxidation | 1.15 μm | <0.5 cm$^{-1}$ | ~5 mm | >400 mW | ≤0.2 dB | 35 C. |

Table III gives measured results from different laser diode technologies for comparison. A slab coupled optical waveguide amplifier (SCOWA) that uses an external fiber Bragg grating cavity based on optical fiber is given for comparison. However the SCOWA uses a thermoelectric heat sink temperature of 16 C. A very broad waveguide of ~4 μm thickness results in a very low internal loss of 0.5 cm$^{-1}$, enabling a 10 mm gain path, but is incompatible with Si photonics. The SCOWA and planar waveguide modes of PIC are difficult to optically match for high coupling efficiency, making the SCOWA approach difficult for PICs. Also note that the DFB laser approach alone shown in the third row, though providing high power at the heat sink temperature 25 C, cannot produce the linewidth, noise floor, or SMSR in accordance with the embodiments described herein. The DFB internal optical loss, though not reported, is typically too high to obtain the necessary cavity quality factor for narrow linewidth and low noise.

7. Details of III-V Chip Fabrication and SOI Mounting

The growth of the QD and QW lasers chips may use generally conventional methodology and dimensions. FIGS. 10 (a)-(g) show the details of the fabrication and integration schemes that can produce a GaAs-based QD or QW gain chip in accordance with the embodiments. FIG. 10 (a) shows the starting epi structure for the QD gain chip. The epi growth is on a p-type substrate, which is a requirement to obtain a low loss optical waveguide when mounted on SOI. A p-type AlAs selective oxidation layer of ~200 Å thickness is grown in a p-type $Al_{0.85}Ga_{0.15}As$ confinement layer that is ~1 μm thick. The oxidation layer will ultimately form the transverse current confinement and index guide of the IIII-V chip. Heterointerfaces are graded and these grading layers are not shown. The p-type $Al_{0.85}Ga_{0.15}As$ layer is the hole injector into a GaAs waveguide that contains one or more QD layers, or one or more InGaAs QWs.

TABLE III

| Laser type | Wavelength | Waveguide loss | Cavity length | Optical power | Heat sink temperature | Linewidth | RIN (db/Hz) | SMSR (dB) | Slope efficiency (%) |
|---|---|---|---|---|---|---|---|---|---|
| InP SCOWA external cavity FBG[1] | 1.55 μm | 0.5 cm$^{-1}$ | 10 mm | 370 mW | 16 C. | 2 kHz | −162 | >60 | 18 (packaged) |
| InP broad area FP[2] | 1.55 μm | 1.3 cm$^1$ | 1.5 mm | 4.5 W (100 μm wide) | 20 C. | | | | 33 |
| InP DFB[3] | 1.55 μm | | 0.6 mm | 160 mW | 25 C. | 600 kHz | −159 | 50 | 31 |
| Wafer fused InP/Si hybrid FP[4] | 1.55 μm | 15 cm$^{-1}$ | 0.86 mm | 3.6 mW (both facets) | 15 C. | | | | 13 |
| Wafer fused InP/Si hybrid racetrack[5] | 1.58 μm | 15 cm$^{-1}$ | 0.4 mm | 29 mW | 15 C. | | | | 16 |
| GaAs QD broad area FP[6] | 1.22 μm | 0.25 cm$^{-1}$ | 16 mm | 2.0 W (100 μm wide) | 25 C. | | | | 29 |

Wafer fused results for Si photonic lasers are shown in rows four and five. These have very high internal optical loss, low power, and use thermoelectric heat sink temperatures of 15 C. The problems with mode matching using wafer fusing were discussed above and stem from a strong evanescent tail that extends into the III-V wafer fused chip. The 15 cm$^{-1}$ internal optical loss and high end loss due to severe mode mismatch prevents these lasers from achieving results comparable to high quality lasers.

The broad area results shown in Table II come close to the waveguide designs proposed in accordance with the embodiments. However the broad area results produce high noise due to lasing on many transverse modes. Their internal losses though are good estimates of what can also be achieved in accordance with the embodiments. Note that the single QD broad area case in row 6 of 0.25 cm$^{-1}$ is the lowest internal loss so far reported, but it does not use a broadened waveguide. Most of the loss in fact does not come from the single QD gain region. In the proposed embodiments one may vary the QD layer number to determine the optimum value for SOI integration. One may expect that three or more QD layers will produce good high temperature lasing characteristics.

6. Laser PIC with Branched Optical Isolator

FIG. 3 shows a general SOI integration in accordance with the embodiments that includes the high power III-V chip, the SBG external cavity reflector, and the optical isolator. The optical isolator is designed to replace the Faraday rotator that is now commonly used in diode laser optoelectronics, but that is incompatible with Si photonics.

The QDs can produce lasing in the wavelength range from 0.9 μm~1.3 μm when grown on GaAs-based materials. The InGaAs QW can reach a wavelength of 1.15 μm just beyond the Si absorption edge and can produce higher gain though also have higher loss. The QD or QW gain region can be grown within a GaAs waveguide that is followed by an n-type electron injecting $Al_{0.1}Ga_{0.9}As/GaAs$ layer. N-type GaAs follows the $Al_{0.1}Ga_{0.9}As$ and provides a high conductivity region to which n-type electrical contacting is made.

Au/Ge n-metal contacting is patterned and alloyed to the upper n-type GaAs contact layer as shown in FIG. 10 (b). The n-metal contacts are ~15 μm wide metal and patterned and alloyed to leave a 15 μm wide central open stripe. The central open stripe will contain the region of the lasing mode.

Next a photoresist pattern can be used to etch the oxidation mesa shown in FIG. 10 (c). Steam oxidation can be used to oxidize the AlAs layer as shown in FIG. 10 (d). This oxidation can be timed to leave an unoxidized p-type AlAs region of ~4 μm width to define the p-type current path and lateral optical mode of the III-V gain chip. This 4 μm width is chosen to produce a single transverse mode when combined with the field overlap of the waveguide. The oxidation layer is positioned to overlap the optical mode sufficiently to provide a weak lateral index guide to the III-V waveguide. In fact a variation of mesa widths will be used to obtain various oxide apertures to study the oxide influence on the transverse lasing field. The oxidation self-aligns the 4 μm aperture to the mesa edges, which is an important advantage of the GaAs-based gain chips.

The selective oxidation can be performed in a furnace tube, with the oxidation performed in the temperature range 400 to 450 C. Once developed the oxidation can be quite controllable at the needed dimensions, but a range of stripe widths can be produced simultaneously to characterize the stripe influence on laser properties. The oxidation can be performed along different crystal directions with little crystallographic influence if a small amount of Ga (~1%) is added to the AlAs. This also increases the quality of the oxide.

To prepare for flip chip mounting to the SOI, a BCB layer can be deposited and patterned as shown in FIG. 10 (e), but only soft baked so that it can be compressed in the SOI mounting. This leaves the mesa ridge extending above the BCB. The p-type substrate can be thinned and metalized for electrical contacting the p side of the III-V chip.

Following metallization of the p-side, the III-V chips will be fully testable as lasers or optical amplifiers. This enables their performance separate from the SOI integration to be fully investigated. Mounting of the III-V on a temperature controlled heat sink stage and probing as shown in FIG. 10 (f) enables the III-V chip to be tested for threshold, internal optical loss, power output, and modal properties, all versus temperature. By using a probe stage, the best performing chips can be tested for SOI integration.

The tested III-V chips will be flip-chip mounted onto the SOI platform as shown in FIG. 10 (g). Different test arrangements will be studied. The SOI platform processing is described above so that the lower clad $SiO_2$ layer of the Si waveguide can be used as the vertical alignment guide. The etched recess region is also described above to laterally align the III-V and Si waveguide. It is expected that lateral alignment of </=0.5 μm can ultimately be achieved using the SOI platform as a lateral alignment guide.

The BCB of the III-V chip can then be compressed as shown in FIG. 6 to bring the III-V waveguide region between the n-metal contacts into intimate contact with the $SiO_2$ of the SOI platform. The critical vertical alignment of the III-V waveguide to the Si waveguide, which also resides on the same $SiO_2$, can be essentially perfect. The III-V chip will be soldered to the heat sinking vias using either AuSn or AuIn solder. The solder temperature is </=280 C for the AuSn, and much less for the AuIn. The III-V chip will be fixed in place with the solder bonds, and then tested in different configurations as shown in FIG. 7.

Figure 11:
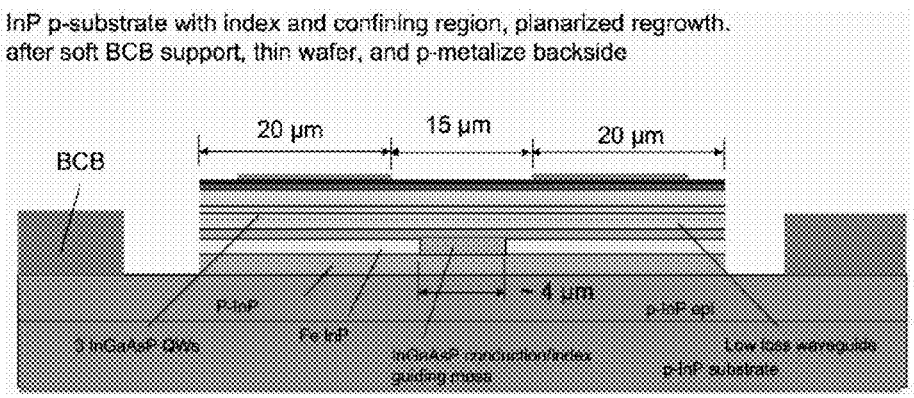
FIG. 11 shows an InP BH QW structure in accordance with the embodiments. The epitaxial layers use three InGaAs QWs grown on a planarized current confining, index guiding region. Two regrowths are needed to produce the epitaxy, a common technique for InP lasers.

The InP chips use the same integration scheme, but its internal design is different and shown in FIG. 11. In this case a BH confinement structure will be used based on epitaxial regrowth processes established for 1.55 μm laser diodes. P-type substrates have been studied extensively for the InP-BH laser diodes and have produced excellent laser properties including high single mode power. In fact, a very wide range of wavelengths become possible using different QD or QW active materials, and different substrate materials.

All references, including publications, patent applications, and patents cited herein are hereby incorporated by reference in their entireties to the extent allowed, and as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein is merely intended to serve as a shorthand method of referring individually to each separate value falling within the range, unless otherwise indicated herein, and each separate value is incorporated into the specification as if it was individually recited herein. The recitation of ranges that includes "about" is intended as 10 to 20% uncertainty, unless specified otherwise or clearly contradicted by context.

All methods described herein may be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An optical component comprising:
   a substrate; and
   an optical isolator comprising a branched shape located over the substrate, the branched shape including at least two branches connected to a trunk at a junction location, where:
      at least one of the at least two branches comprises an optical absorber material and is contiguous with the trunk; and
      at least one of the at least two branches comprises an optical transmitter material and is separated from the trunk by a gap.

2. The optical component of claim 1 wherein the substrate comprises a silicon substrate.

3. The optical component of claim 1 wherein:
   the optical absorber material comprises a doped silicon material; and
   the optical transmitter material comprises a monocrystalline silicon material.

4. The optical component of claim 1 wherein each of the at least two branches has:
   a width from about 1 to about 20 microns; and
   a thickness from about 0.5 to about 5 microns.

5. The optical component of claim 1 wherein the gap has a width from about 0.0001 to about 1 microns.

6. An optical component comprising:
   a substrate; and
   a branched shape optical isolator comprising at least two branches connected to a trunk at a junction location and located over the substrate, wherein:
      at least one branch within the at least two branches comprises an optical absorber material;

at least one branch within the at least two branches comprises an optical transmitter material and terminates over the substrate at an assembly location for an optical chip with respect to the substrate, the assembly location including at least one registration guide, wherein:

the branched shape optical isolator and the registration guide comprise the same material; and the branched shape optical isolator and the registration guide rise above the substrate surface by the same amount.

7. The optical component of claim 6 wherein the branch that terminates at the assembly location for the optical chip terminates in a vertical face at the assembly location for the optical chip.

8. The optical component of claim 6 wherein the assembly location for the optical chip includes at least one registration guide for the optical chip rising above the substrate.

9. An optical component comprising:
a substrate; and
a branched shape optical isolator comprising at least two branches connected to a trunk at a junction location and located over the substrate, wherein:
at least one branch within the at least two branches comprises an optical absorber material;
at least one branch within the at least two branches comprises an optical transmitter material and terminates over the substrate at an assembly location for an optical chip with respect to the substrate, the assembly location including at least one registration guide wherein the assembly location for the optical chip includes at least one registration guide for the optical chip penetrating into the substrate, wherein the at least one registration guide is a linewidth tapered rectangular recess.

10. The optical component of claim 9 wherein the linewidth tapered rectangular recess includes a heat sink structure.

11. An optical component comprising:
a substrate;
a branched shape optical isolator including at least two branches connected to a trunk at a junction location and located over the substrate, wherein:
at least one of the at least two branches comprises an optical absorber material;
at least one of the at least two branches comprises an optical transmitter material and terminates over the substrate with a vertical face at an assembly location for an optical chip, the assembly location including at least one registration guide; and the optical chip assembled at the assembly location over the substrate, wherein the branched shape optical isolator and the registration guide comprise the same material; and the branched shape optical isolator and the registration guide rise above the substrate surface by the same amount.

12. The optical component of claim 11 wherein an optical output location of the optical chip is vertically aligned with the vertical face of the branch that terminates at the assembly location.

13. The optical component of claim 12 wherein the vertically aligned optical output location of the optical chip and vertical face of the branch that terminates at the assembly location are separated by no greater than about 10 nanometers.

14. The optical component of claim 13 wherein a portion of the optical chip and a portion of the branch that terminates at the assembly location together comprise a laser.

15. An optical component comprising:
a substrate; and
a branched shape optical isolator comprising at least two branches connected to a trunk at a junction location and located over the substrate, wherein:
at least one branch within the at least two branches comprises an optical absorber material and is contiguous with the trunk;
at least one branch within the at least two branches comprises an optical transmitter material that is separated from the trunk by a gap and terminates over the substrate at an assembly location for an optical chip with respect to the substrate.

16. An optical component comprising:
a substrate; and
a branched shape optical isolator comprising at least two branches connected to a trunk at a junction location and located over the substrate, wherein:
at least one branch within the at least two branches comprises an optical absorber material and is contiguous with the trunk;
at least one branch within the at least two branches comprises an optical transmitter material that is separated from the trunk by a gap and terminates over the substrate at an assembly location for an optical chip with respect to the substrate; and
an optical chip located at the assembly location for the optical chip.

* * * * *